(12) United States Patent
Uenishi

(10) Patent No.: US 6,511,783 B1
(45) Date of Patent: Jan. 28, 2003

(54) NEGATIVE RESIST COMPOSITION

(75) Inventor: Kazuya Uenishi, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/636,811

(22) Filed: Aug. 10, 2000

(30) Foreign Application Priority Data

Aug. 11, 1999 (JP) .......................................... 11-227792

(51) Int. Cl.⁷ ............................................... G03F 7/004
(52) U.S. Cl. ..................... 430/270.1; 430/914; 430/921; 430/927
(58) Field of Search ............................. 430/270.1, 914, 430/921, 927

(56) References Cited

U.S. PATENT DOCUMENTS

| | | | |
|---|---|---|---|
| 5,286,600 A | 2/1994 | Ochiai et al. ............... | 430/270 |
| 5,344,742 A | 9/1994 | Sinta et al. ................. | 430/270 |
| 5,731,364 A * | 3/1998 | Sinta et al. .................... | 522/31 |
| 6,083,658 A * | 7/2000 | Kunita et al. ............. | 430/270.1 |
| 6,383,714 B1 * | 5/2002 | Nakamura et al. ....... | 430/270.1 |

FOREIGN PATENT DOCUMENTS

| | | | |
|---|---|---|---|
| EP | 0 444 493 A2 | 9/1991 | |
| EP | 0 579 420 A2 | 1/1994 | |
| EP | 0 874 282 A1 | 10/1998 | |
| JP | 2-52348 | 2/1990 | ........... G03F/7/004 |
| JP | 2-150848 | 6/1990 | ........... G03F/7/095 |
| JP | 3-75652 | 3/1991 | ........... G03F/7/038 |
| JP | 3-87746 | 4/1991 | ........... G03F/7/023 |
| JP | 4-210960 | 8/1992 | ......... C07C/381/14 |
| JP | 4-217249 | 8/1992 | ........... G03F/7/004 |
| JP | 4-226454 | 8/1992 | ........... G03F/7/004 |
| JP | 4-291259 | 10/1992 | ........... G03F/7/038 |
| JP | 4-367864 | 12/1992 | ........... G03F/7/029 |
| JP | 4-367865 | 12/1992 | ........... G03F/7/029 |
| JP | 5-134412 | 5/1993 | ........... G03F/7/038 |
| JP | 6-3825 | 1/1994 | ........... G03F/7/038 |
| JP | A-6-199770 | 7/1994 | |
| JP | 6-199770 | 7/1994 | ......... C07C/305/22 |
| JP | 6-236024 | 8/1994 | ........... G03F/7/004 |
| JP | 8-3635 | 1/1996 | ........... G03F/7/038 |

OTHER PUBLICATIONS

European Search Report.

* cited by examiner

*Primary Examiner*—Rosemary Ashton
(74) *Attorney, Agent, or Firm*—Sughrue Mion, PLLC

(57) ABSTRACT

A chemical amplification system negative resist composition for an electron beam and/or an X-ray, which is excellent in sensitivity and resolution and has a rectangular profile, comprising an alkali-soluble resin, a radiation-sensitive acid generator and a crosslinking agent which initiates crosslinking by an acid, in which the crosslinking agent is a phenol derivative having 3 to 5 benzene ring atomic groups in a molecule, having a molecular weight of 1,200 or less, and having two or more hydroxymethyl and/or alkoxymethyl groups in all in the molecule, the groups being combined with at least any of the benzene ring atomic groups.

7 Claims, No Drawings

NEGATIVE RESIST COMPOSITION

FIELD OF THE INVENTION

The present invention relates to a negative resist composition suitably used in an ultramicrolithography process or another photofabrication process for the production of very large-scale integrated circuits or high capacity microchips. More particularly, the invention relates to a negative resist composition which can form highly miniaturized patterns by use of X-rays or electron beams including excimer laser beams, and especially to a negative resist composition which can be suitably used in miniaturization processing of semiconductor elements by use of high energy beams such as electron beams.

BACKGROUND OF THE INVENTION

Integrated circuits have been progressively increased in their integration degree, and therefore processing of ultra-micro patterns having a line width of a half micron or less has become necessary in the production of semiconductor substrates for very large-scale integrated circuits. For fulfilling this necessity, the wavelength of light used in an exposure apparatus employed for photolithography becomes progressively shorter, and now, far ultraviolet light and excimer laser light (such as XeCl, KrF or ArF) has been studied. Further, the formation of more micro patterns with electron beams or X-rays has been studied.

In particular, electron beams or X-rays are placed as next or next-next generation technology of pattern formation, and the development of negative resists which can attain high sensitivity, high resolution and rectangular profile shape has been desired.

Electron beam lithography is technology in which accelerated electron beams emit energy in the course of colliding with atoms constituting resist materials to cause scattering, thereby exposing the resist materials. The use of highly accelerated electron beams increases the rectilinear propagation and reduces the influence of electron scattering, which makes it possible to form rectangular patterns having high resolution. On the other hand, it increases the permeability of electron beams, resulting in lowered sensitivity. As described above, in the electron beam lithography, there is the trade-off relationship between the sensitivity and the resolution/resist shape, and it has been a problem how to allow them to be compatible with each other. With respect to chemical amplification type negative resists, various acid generators have hitherto been proposed. JP-B-8-3635 (the term "JP-B" as used herein means an "examined Japanese patent publication") discloses organic halogen compounds, JP-A-2-150848 (the term "JP-A" as used herein means an "unexamined published Japanese patent application) and JP-A-6-199770 disclose iodonium salts and sulfonium salts, JP-A-2-52348, JP-A-4-367864 and JP-A-4-367865 disclose acid generators containing Cl or Br, JP-A-4-210960 and JP-A-4-217249 disclose diazodisulfone and diazosulfone compounds, JP-A-4-226454 discloses triazine compounds, and JP-A-3-87746, JP-A-4-291259, JP-A-6-236024 and U.S. Pat. No. 5,344,742 disclose sulfonate compounds. However, these acid generators have failed to overcome the trade-off relationship between the sensitivity and the resolution/resist shape under irradiation of electron beams.

As to crosslinking agents, methylolmelamine, resol resins, epoxidated novolak resins and urea resins have hitherto been used. However, these crosslinking agents are unstable to heat, so that they have a problem with regard to storage stability when used in resist solutions. Further, they have failed to satisfy required characteristics of high sensitivity, high resolution and rectangular resist shape under irradiation of electron beams.

SUMMARY OF THE INVENTION

It is therefore an object of the invention to solve the problems in respect to techniques for improving the original performance of the micro photofabrication using electron beams, and to develop chemical amplification system negative resist compositions for electron beams or X-rays satisfying the characteristics of sensitivity and resolution/resist shape to the use of the electron beams or the X-rays.

As a result of intensive studies, the present inventors have known that the above-mentioned various objects of the invention are attained by using specific photoacid generators and/or specific crosslinking agents, depending on the type of photosensitive composition, thus completing the invention.

That is to say, these and other objects of the invention are attained by the following:

(1) A chemical amplification system negative resist composition for an electron beam and/or an X-ray comprising an alkali-soluble resin, a radiation-sensitive acid generator and a crosslinking agent which initiates crosslinking by an acid, wherein the crosslinking agent is a phenol derivative having 3 to 5 benzene ring atomic groups in a molecule, having a molecular weight of 1,200 or less, and having two or more hydroxymethyl and/or alkoxymethyl groups in all in the molecule, the groups being combined with at least any of the benzene ring atomic groups;

(2) The negative resist composition according to claim 1, wherein the radiation-sensitive acid generator is a compound represented by any one of the following general formulas (I) to (III):

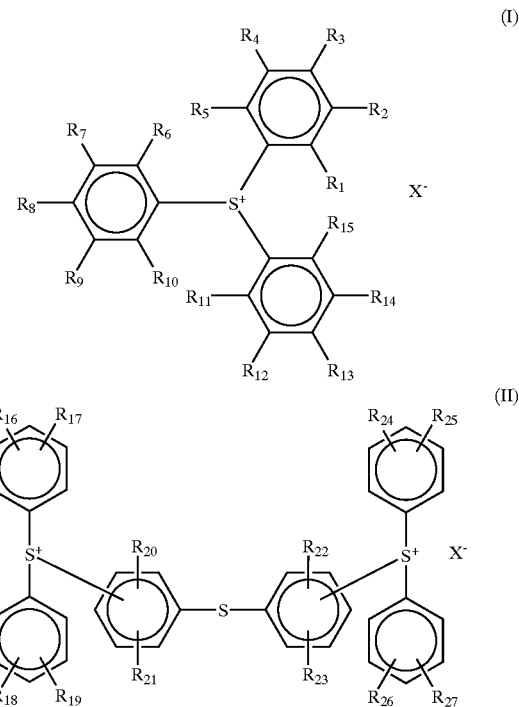

3
-continued

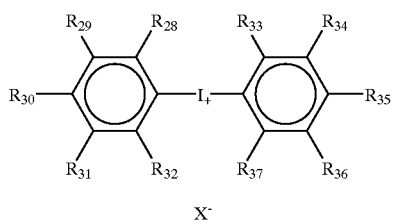

(III)

X⁻ wherein $R_1$ to $R_{37}$ each represents a hydrogen atom, an alkyl group, an alkoxyl group, a hydroxyl group, a halogen atom or a group represented by —S—$R_{38}$ wherein $R_{38}$ represents an alkyl group or an aryl group; $R_1$ to $R_{38}$ may be the same or different; two or more selected from $R_1$ to $R_{15}$ may be combined with each other directly at their ends, or through an atom selected from oxygen, sulfur and nitrogen to form a ring structure; $R_{16}$ to $R_{27}$ may also form a ring structure similarly; $R_{28}$ to $R_{37}$ may also form a ring structure similarly; $X^-$ is an anion of an acid, which is selected from benzenesulfonic acid, naphthalenesulfonic acid and anthracenesulfonic acid; the acid is substituted by a fluorine atom, and has at least one organic group selected from the group consisting of an alkyl group, an alkoxyl group, an acyl group, an acyloxy group, a sulfonyl group, a sulfonyloxy group, a sulfonylamino group, an aryl group, an aralkyl group and an alkoxycarbonyl group; and moreover, the organic group is further substituted by at least one fluorine atom; and (3) The negative resist composition according to claim 2, wherein each of the alkyl group and the alkoxyl group is any one of straight-chain, branched or cyclic groups.

Embodiments of the negative resist compositions of the invention include (1) and (2) described below:

(1) A negative resist composition comprising an alkali-soluble resin, a radiation-sensitive acid generator and a crosslinking agent, in which the crosslinking agent is a phenol derivative having 3 to 5 benzene ring atomic groups in a molecule, having a molecular weight of 1,200 or less, and having two or more hydroxymethyl and/or alkoxymethyl groups in all in the molecule, the groups being combined with at least any of the benzene ring atomic groups, and initiates crosslinking by an acid; and (2) A negative resist composition comprising an alkali-soluble resin, a radiation-sensitive acid generator represented by any one of general formulas (I) to (III) and a crosslinking agent, in which the crosslinking agent is a phenol derivative having 3 to 5 benzene ring atomic groups in a molecule, having a molecular weight of 1,200 or less, and having two or more hydroxymethyl and/or alkoxymethyl groups in all in the molecule, the groups being combined with at least any of the benzene ring atomic groups, and initiates crosslinking by an acid.

In the invention, of the above-mentioned embodiments (1) and (2), the embodiment (1) is preferred in that the effects of the invention are achieved more significantly.

4
DETAILED DESCRIPTION OF THE INVENTION

The compounds used in the invention are described below:

(1) Alkali-Soluble Resins Used in the Invention

In the invention, the alkali-soluble resins are used together with the radiation-sensitive acid generators. Examples of the alkali-soluble resins used together with the radiation-sensitive acid generators include but are not limited to novolak resins, hydrogenated novolak resins, acetone-pyrogallol resins, poly-o-hydroxystyrene, poly-m-hydroxystyrene, poly-p-hydroxystyrene, hydrogenated poly-hydroxystyrene, halogen- or alkyl-substituted polyhydroxy-styrenes, hydroxystyrene-N-substituted maleimide copolymers, o/p- and m/p-hydroxystyrene copolymers, products partially O-alkylated to hydroxyl groups of polyhydroxystyrene (e.g., 5 to 30 mol % O-methylated products, O-(1-methoxy)ethylated products, O-(1-ethoxy)ethylated products, O-2-tetrahydropyranylated products and O-(t-butoxycarbonyl)methylated products), or O-acylated products (e.g., 5 to 30 mol % O-acetylated products and O-(t-butoxy)carbonylated products), styrene-maleic anhydride copolymers, styrene-hydroxystyrene copolymers, α-methylstyrene-hydroxystyrene copolymers, carboxyl group-containing methacrylic resins and derivatives thereof.

Of the above-mentioned alkali-soluble resins, particularly preferred are novolak resins, poly-o-hydroxystyrene, poly-m-hydroxystyrene, poly-p-hydroxystyrene and copolymers thereof, alkyl-substituted polyhydroxy-styrenes, partially O-alkylated or O-acylated products of polyhydroxystyrene, styrene-hydroxystyrene copolymers and α-methylstyrene-hydroxystyrene copolymers.

The novolak resins are obtained by addition condensation of specified monomers as main components with aldehydes in the presence of acidic catalysts.

The specified monomers include but are not limited to phenols, cresols such as m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, o-ethylphenol, p-t-butylphenol, p-octylphenol and 2,3,5-trimethylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, bisalkylphenols such as 2-methyl-4-isopropylphenol, and hydroxy aromatic compounds such as m-chlorophenol, p-chlorophenol, o-chlorophenol, dihydroxybiphenyl, bisphenol A, phenylphenol, resorcinol and naphthol. These monomers can be used either alone or as a combination of two or more of them.

The aldehydes include, for example, formaldehyde, paraformaldehyde, acetaldehyde, propionaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde and acetals thereof such as chloroacetaldehyde diethylacetal. Of these, formaldehyde is preferably used.

These aldehydes are used either alone or as a combination of two or more of them. As the acidic catalysts, hydrochloric acid, sulfuric acid, formic acid, acetic acid and oxalic acid can be used.

It is preferred that the novolak resins thus obtained have a weight-average molecular weight ranging from 1,000 to 30,000. Less than 1,000 causes an increase in the film thickness loss of exposed areas after development, whereas exceeding 30,000 results in decreased developing speed. The particularly preferred range is from 2,000 to 20,000.

Further, the weight-average molecular weight of polyhydroxystyrene, the derivatives thereof and the copolymers thereof other than the novolak resins is 2,000 or more, preferably from 2,000 to 30,000, and more preferably from 2,000 to 20,000.

The weight-average molecular weight as used herein is defined as a value measured by gel permeation chromatography and reduced to the weight-average molecular weight of polystyrene.

The rate of alkali dissolution of the alkali-soluble resins is preferably 20 Å/second or more, and particularly preferably 200 Å/second or more, when measured in 0.261 N tetramethylammonium hydroxide (TMAH) at 23° C.

In the present invention, these alkali-soluble resins may be used either alone or as a combination of two or more of them.

The alkali-soluble resins are used usually in an amount of 30% to 90% by weight, and preferably in an amount of 50% to 80% by weight, based on the total weight of resist composition (excluding solvents).

(2) Radiation-Sensitive Acid Generators (hereinafter also referred to as Photoacid Generators)

The radiation-sensitive acid generators are used together with the alkali-soluble resins. The radiation-sensitive acid generators used together with the alkali-soluble resins are represented by the above-mentioned general formulas (I) to (III).

$R_1$ to $R_{37}$ in general formulas (I) to (III) each represents an alkyl group, an alkoxyl group, a hydroxyl group, a halogen atom or a group represented by —S—$R_{38}$.

The alkyl groups represented by $R_1$ to $R_{37}$ may be straight-chain, branched or cyclic. The straight-chain or branched alkyl groups include, for example, alkyl groups each having 1 to 4 carbon atoms such as methyl, ethyl, propyl, n-butyl, sec-butyl and t-butyl. The cyclic alkyl groups include, for example, alkyl groups each having 3 to 8 carbon atoms such as cyclopropyl, cyclopentyl and cyclohexyl.

The alkoxyl groups represented by $R_1$ to $R_{37}$ may be straight-chain, branched or cyclic. The straight-chain or branched alkoxyl groups include, for example, alkoxyl groups each having 1 to 8 carbon atoms such as methoxy, ethoxy, hydroxyethoxy, propoxy, n-butoxy, isobutoxy, sec-butoxy, t-butoxy and octyloxy. The cyclic alkoxyl groups include, for example, cyclopentyloxy and cyclohexyloxy.

The halogen atoms represented by $R_1$ to $R_{37}$ include a fluorine atom, a chlorine atom, a bromine atom and an iodine atom.

$R_{38}$ in —S—$R_{38}$ represented by $R_1$ to $R_{37}$ is an alkyl group or an aryl group. The alkyl groups represented by $R_{38}$ include, for example, ones already enumerated as the alkyl groups represented by $R_1$ to $R_{37}$.

The aryl groups represented by $R_{38}$ include aryl groups each having 6 to 14 carbon atoms such as phenyl, tolyl, methoxyphenyl and naphthyl.

Any one of the groups represented by $R_1$ to $R_{38}$ may further be combined with a substituent to increase the carbon number, or have no substituent. Preferred examples of the substituents with which the groups may further be combined include alkoxyl groups each having 1 to 4 carbon atoms, aryl groups each having 6 to 10 carbon atoms and alkenyl groups each having 2 t 6 carbon atoms such as cyano, hydroxyl, carboxyl, alkoxycarbonyl and nitro. In addition, the substituents may be halogen atoms such as fluorine, chlorine and iodine.

Two or more of the groups represented by $R_1$ to $R_{15}$ in general formula (I) may be combined to form a ring. The groups represented by $R_1$ to $R_{15}$ may be combined with each other directly at their ends, or indirectly through at least one atom selected from carbon, oxygen, sulfur and nitrogen to form the ring. The ring structures formed by combination of two or more of $R_1$ to $R_{15}$ include the same structures as the ring structures seen in furan, dihydrofuran, pyran, trihydropyran, thiophene and pyrrole rings. $R_{16}$ to $R_{27}$ in general formula (II) are similar to the above. Two or more of them may be combined directly or indirectly with each other to form a ring. $R_{28}$ to $R_{37}$ in general formula (III) are also similar thereto.

General formulas (I) to (III) have $X^-$, which is an anion of an acid. The acid which forms the anion is an acid selected from benzenesulfonic acid, naphthalenesulfonic acid and anthracenesulfonic acid. The acid is substituted by at least one fluorine atom, or has at least one organic group selected from the group consisting of an alkyl group, an alkoxyl group, an acyl group, an acyloxy group, a sulfonyl group, a sulfonyloxy group, a sulfonylamino group, an aryl group, an aralkyl group and an alkoxycarbonyl group, together with or instead of the fluorine atom. Moreover, the organic group is further substituted by at least one fluorine atom. The above-mentioned benzenesulfonic acid, naphthalenesulfonic acid or anthracenesulfonic acid may be substituted by a halogen atom other than fluorine, a hydroxyl group or a nitro group.

The alkyl groups combined with benzenesulfonic acid or the like which forms the $X^-$ anion are, for example, alkyl groups each having 1 to 12 carbon atoms. The alkyl groups may be straight-chain, branched or cyclic. They are each substituted by at least one fluorine atom, preferably 25 or less fluorine atoms. Specific examples thereof include trifluoromethyl, pentafluoroethyl, 2,2,2-trifluoroethyl, heptafluoropropyl, heptafluoroisopropyl, perfluorobutyl, perfluorooctyl, perfluorododecyl and perfluorocyclohexyl. Perfluoroalkyl groups each having 1 to 4 carbon atoms in which all are substituted by fluorine atoms are preferred among others.

The alkoxyl groups combined with benzenesulfonic acid or the like described above, together with or independently of the alkyl groups, are alkoxyl groups each having 1 to 12 carbon atoms. The alkoxyl groups may be straight-chain, branched or cyclic. They are each substituted by at least one fluorine atom, preferably 25 or less fluorine atoms. Specific examples thereof include trifluoromethoxy, pentafluoroethoxy, heptafluoroisopropyloxy, perfluorobutoxy, perfluorooctyloxy, perfluorododecyloxy and perfluorocyclohexyloxy. Perfluoroalkoxyl groups each having 1 to 4 carbon atoms in which all are substituted by fluorine atoms are preferred among others.

The acyl groups combined with benzenesulfonic acid or the like described above, together with or independently of the alkyl groups, are preferably acyl groups each having 2 to 12 carbon atoms and substituted by 1 to 23 fluorine atoms.

Specific examples thereof include trifluoroacetyl, fluoroacetyl, pentafluoropropionyl and pentafluorobenzoyl.

The acyloxy groups combined with benzenesulfonic acid or the like described above, together with or independently of the alkyl groups, are preferably acyloxy groups each having 2 to 12 carbon atoms and substituted by 1 to 23 fluorine atoms. Specific examples thereof include trifluoroacetoxy, fluoroacetoxy, pentafluoropropionyloxy and pentafluorobenzoyloxy.

The sulfonyl groups combined with benzenesulfonic acid or the like described above, together with or independently of the alkyl groups, are preferably sulfonyl groups each having 1 to 12 carbon atoms and substituted by 1 to 25 fluorine atoms. Specific examples thereof include trifluoromethanesulfonyl, pentafluoroethanesulfonyl, perfluorobutanesulfonyl, perfluorooctanesulfonyl, pentafluorobenzenesulfonyl and 4-trifluoromethylbenzenesulfonyl.

The sulfonyloxy groups combined with benzenesulfonic acid or the like described above, together with or independently of the alkyl groups, are preferably sulfonyloxy groups each having 1 to 12 carbon atoms and substituted by 1 to 25 fluorine atoms. Specific examples thereof include trifluoromethanesulfonyloxy, perfluorobutanesulfonyloxy and 4-trifluoromethylbenzenesulfonyloxy.

The sulfonylamino groups combined with benzenesulfonic acid or the like described above, together with or independently of the alkyl groups, are preferably sulfonylamino groups each having 1 to 12 carbon atoms and substituted by 1 to 25 fluorine atoms. Specific examples thereof include trifluoromethanesulfonylamino, perfluorobutanesulfonylamino, perfluorooctanesulfonylamino and pentafluorobenzenesulfonylamino.

The aryl groups combined with benzenesulfonic acid or the like described above, together with or independently of the alkyl groups, are preferably aryl groups each having 6 to 14 carbon atoms and substituted by 1 to 9 fluorine atoms. Specific examples thereof include pentafluorophenyl, 4-trifluoromethylphenyl, heptafluoronaphthyl, nonafluoroanthranyl, 4-fluorophenyl and 2,4-difluorophenyl.

The aralkyl groups combined with benzenesulfonic acid or the like described above, together with or independently of the alkyl groups, are preferably aralkyl groups each having 7 to 10 carbon atoms and substituted by 1 to 15 fluorine atoms. Specific examples thereof include pentafluorophenylmethyl, pentafluorophenylethyl, perfluorobenzyl and perfluorophenethyl.

The alkoxycarbonyl groups combined with benzenesulfonic acid or the like described above, together with or independently of the alkyl groups, are preferably alkoxycarbonyl groups each having 2 to 13 carbon atoms and substituted by 1 to 25 fluorine atoms. Specific examples thereof include trifluoromethoxycarbonyl, pentafluoroethoxycarbonyl, pentafluorophenoxycarbonyl, perfluorobutoxycarbonyl and perfluorooctyloxycarbonyl.

Of such $X^-$ anions, most preferred is a fluorine-substituted benzenesulfonic acid anion, and a pentafluorobenzenesulfonic acid anion is particularly preferred among others.

In addition, benzenesulfonic acid, naphthalenesulfonic acid or anthracenesulfonic acid having the above-mentioned fluorine-containing substituent may be further substituted by a straight-chain, branched or cyclic alkoxyl group, an acyl group, an acyloxy group, a sulfonyl group, a sulfonyloxy group, a sulfonylamino group, an aryl group, an aralkyl group, an alkoxycarbonyl group (the carbon number range of these groups is the same as described above), a halogen atom (extruding fluorine), a hydroxyl group or a nitro group.

Specific examples of these compounds represented by general formulas (I) to (III) are shown below, but are not limited thereto.

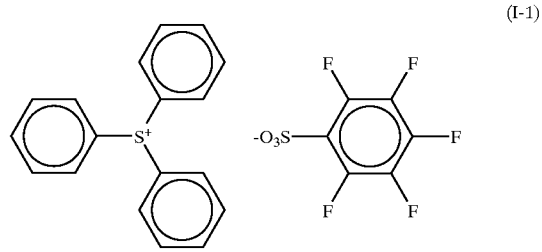

(I-1)

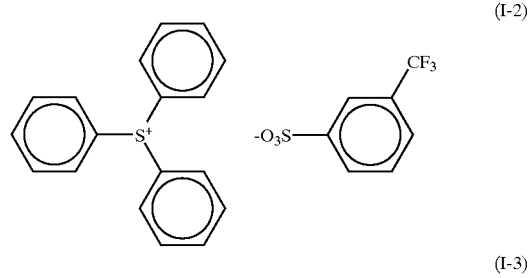

(I-2)

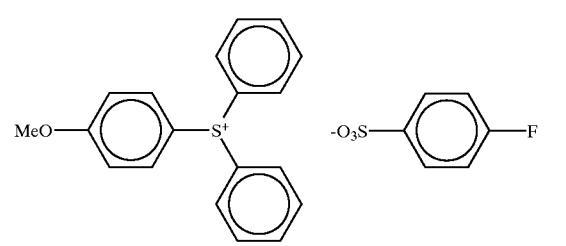

(I-3)

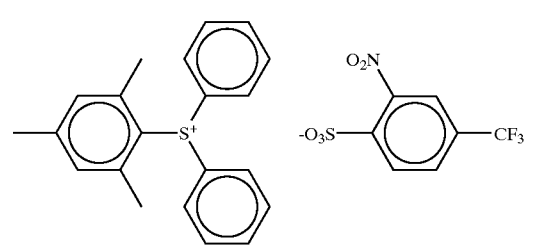

(I-4)

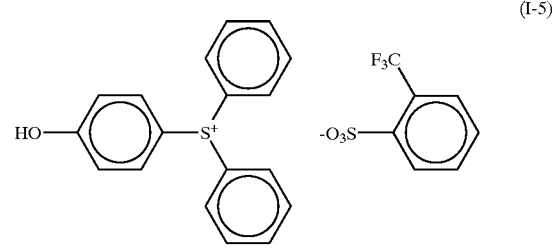

(I-5)

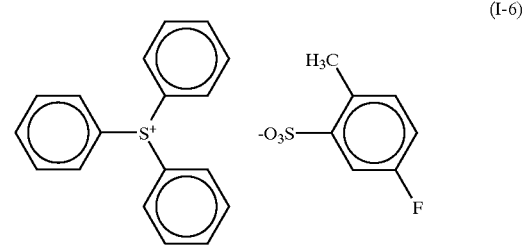

(I-6)

(I-7)
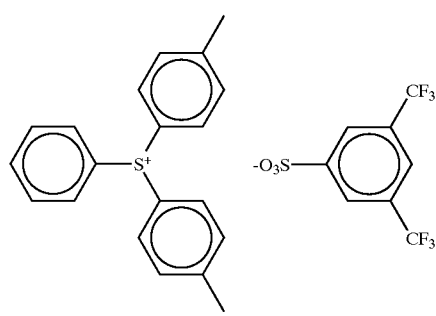 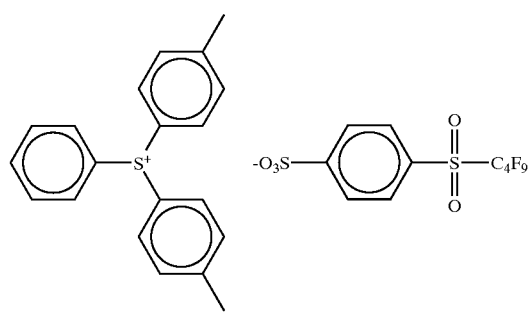
(I-8)
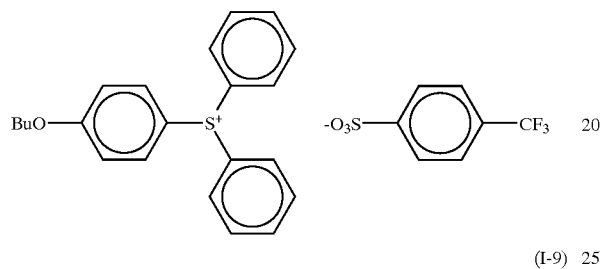
(I-9)
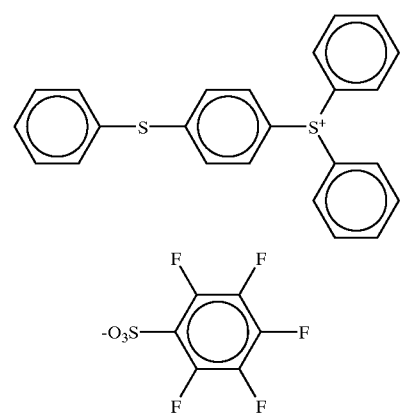
(I-10)
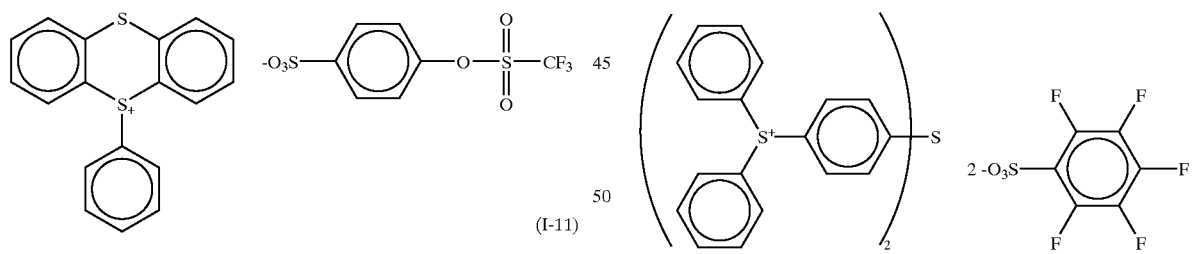
(I-11)
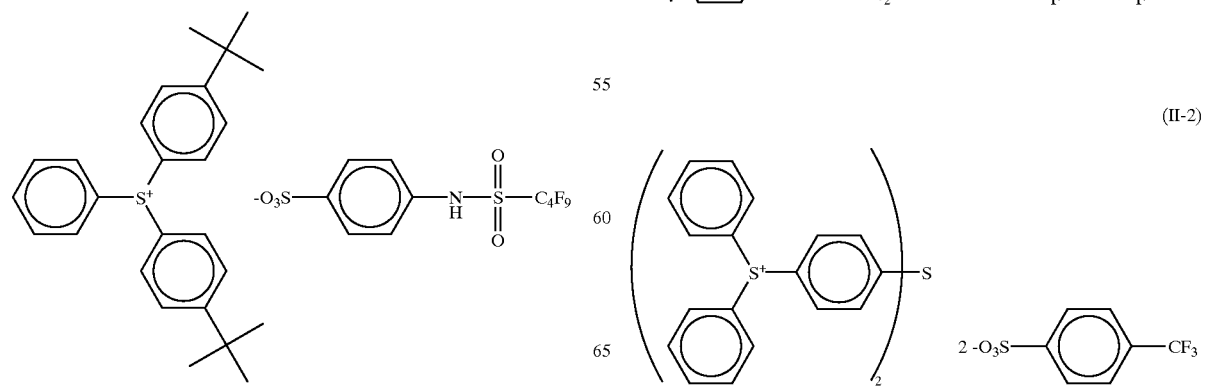
(I-12)
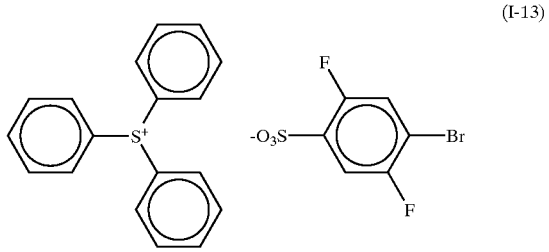
(I-13)
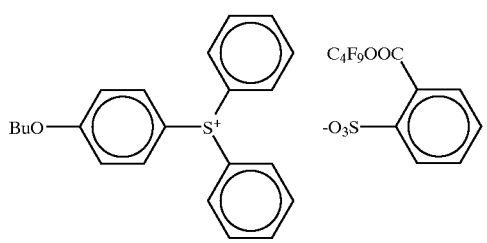
(I-14)
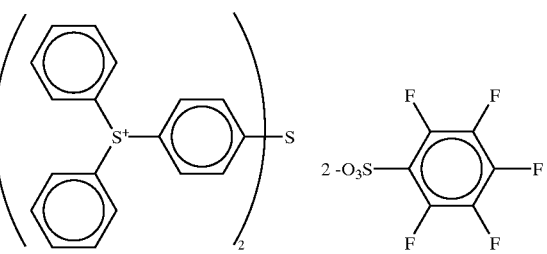
(II-1)
(II-2)
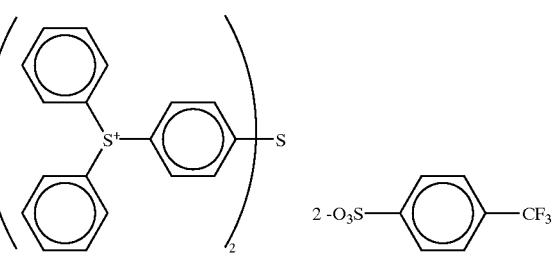

-continued

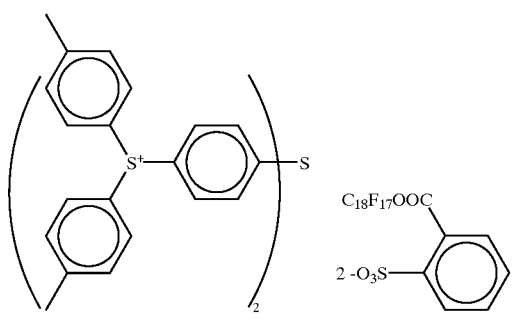
(II-3)

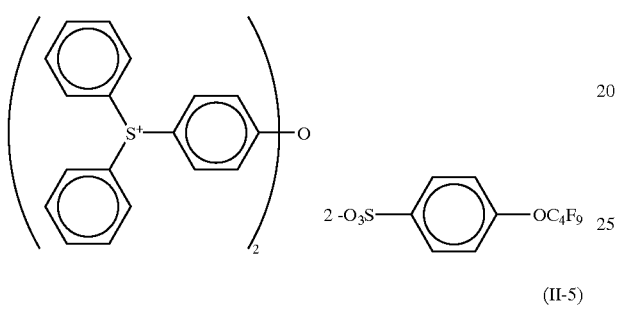
(II-4)

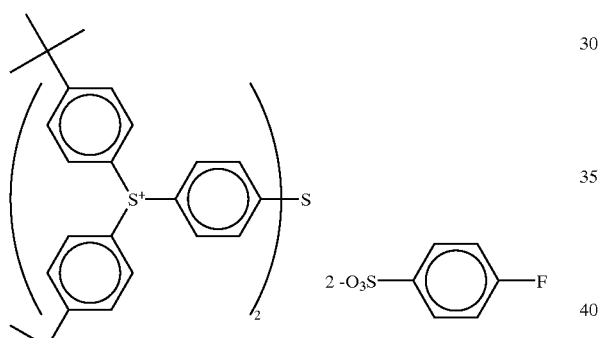
(II-5)

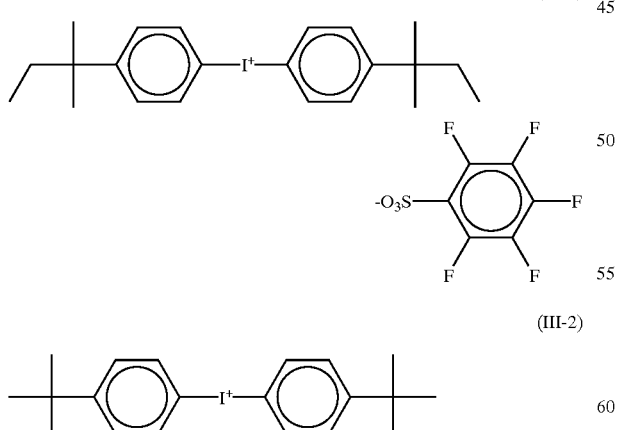
(III-1)

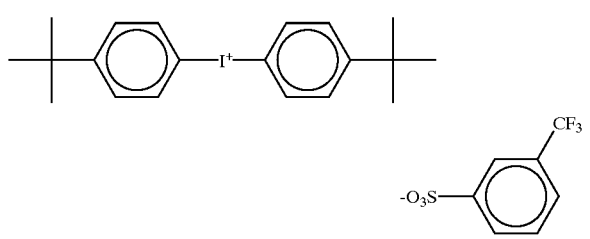
(III-2)

-continued

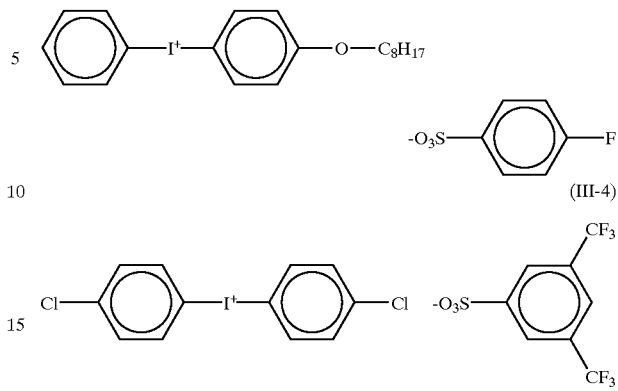
(III-3)
(III-4)
(III-5)

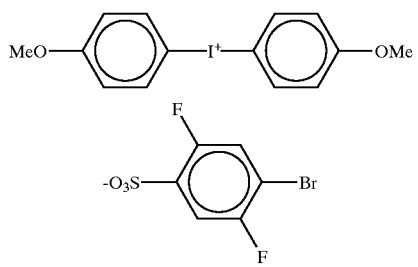
(III-6)
(III-7)
(III-8)

The compounds of general formulas (I) and (II) can be synthesized by the following processes. For example, aryl Grignad reagents such as arylmagnesium bromides are reacted with phenyl sulfoxides to obtain triarylsulfonium halides, and the salt interchange thereof with sulfonic acids corresponding thereto is conducted. As another process, the condensation and salt interchange of phenyl sulfoxides with aromatic compounds corresponding thereto are conducted using acid catalysts such as methanesulfonic acid/ diphosphorus pentaoxide or aluminum chloride. Further, the compounds can be synthesized by a process in which the condensation and salt interchange of diaryliodonium salts with diaryl sulfides are conducted using catalysts such as copper acetate. In any one of the above-mentioned processes, the phenyl sulfoxides may have substituents at benzene rings, or may not have such substituents.

The compounds of general formula (III) can be synthesized by reacting aromatic compounds using periodates.

The amount of the photoacid generators used in the invention is suitably from 0.1% to 20% by weight, preferably from 0.5% to 10% by weight, and more preferably from 1% to 7% by weight, based on the total solid content of negative resist composition.

When the compounds represented by any one of general formulas (I) to (III) are contained as the radiation-sensitive acid generators, the content thereof is suitably from 0.1% to 20% by weight, preferably from 0.5% to 10% by weight, and more preferably from 1% to 7% by weight, based on the total solid content of negative resist composition.

(Other Photoacid Generators)

In the invention, other compounds which are decomposed by radiation irradiation to generate acids can be used, except or together with the compounds represented by general formulas (I) to (III). When the other compounds which are decomposed by radiation irradiation to generate acids are used except or together with the compounds represented by general formulas (I) to (III), the ratio of the other compounds which are decomposed by radiation irradiation to generate acids to the compounds represented by general formulas (I) to (III) is from 100/0 to 20/80, preferably from 90/10 to 40/60, and more preferably from 80/20 to 50/50, in molar ratio.

As such other photoacid generators, photo-initiators for cationic photopolymerization, photoinitiators for radical photopolymerization, photodecoloring agents and photodiscloring agents for dyes, known photoacid generating compounds used in micro resists and mixtures thereof can be appropriately selected to use them.

Examples thereof include onium salts such as diazonium salts, phosphonium salts, iodonium salts, sulfonium salts, selenonium salts and arsonium salts, organic halogen compounds, organic metal/organic halides, photoacid generators having o-nitrobenzyl type protective groups, compounds producing sulfonic acids by photolysis, which are represented by iminosulfonates, and disulfone compounds.

Further, compounds in which these photoacid generating groups or compounds are introduced into their main chains or side chains, for example, compounds described in JP-A-63-26653, JP-A-55-164824, JP-A-62-69263, JP-A-63-146038, JP-A-63-163452, JP-A-62-153853 and JP-A-63-146029, can be used.

Furthermore, photoacid generating compounds described in U.S. Pat. No. 3,779,778 and European Patent 126,712 can also be used.

(3) Crosslinking Agents Used in the Invention

In the negative resist compositions of the invention, compounds crosslinking by acids (hereinafter referred to as acid-crosslinking agents or briefly crosslinking agents) are used together with the photoacid generators.

As the crosslinking agents, phenol derivatives can be used. Examples thereof include phenol derivatives having a molecular weight of 1,200 or less, each containing 3 to 5 benzene rings in a molecule and each having two or more of hydroxymethyl groups or alkoxymethyl groups in all, in which the hydroxymethyl groups or alkoxymethyl groups are bonded collectively to at least any one of the benzene rings, or divisionally to the benzene rings.

The alkoxymethyl groups bonded to the benzene rings are preferably alkoxymethyl groups each having 6 or less carbon atoms. Preferred examples thereof include methoxymethyl, ethoxymethyl, n-propoxymethyl, i-propoxymethyl, n-butoxymethyl, i-butoxymethyl, sec-butoxymethyl and t-butoxymethyl. Further, alkoxy-substituted alkoxyl groups such as 2-methoxyethoxy and 2-methoxy-1-propyl are also preferred.

Of these phenol derivatives, particularly preferred ones are shown below:

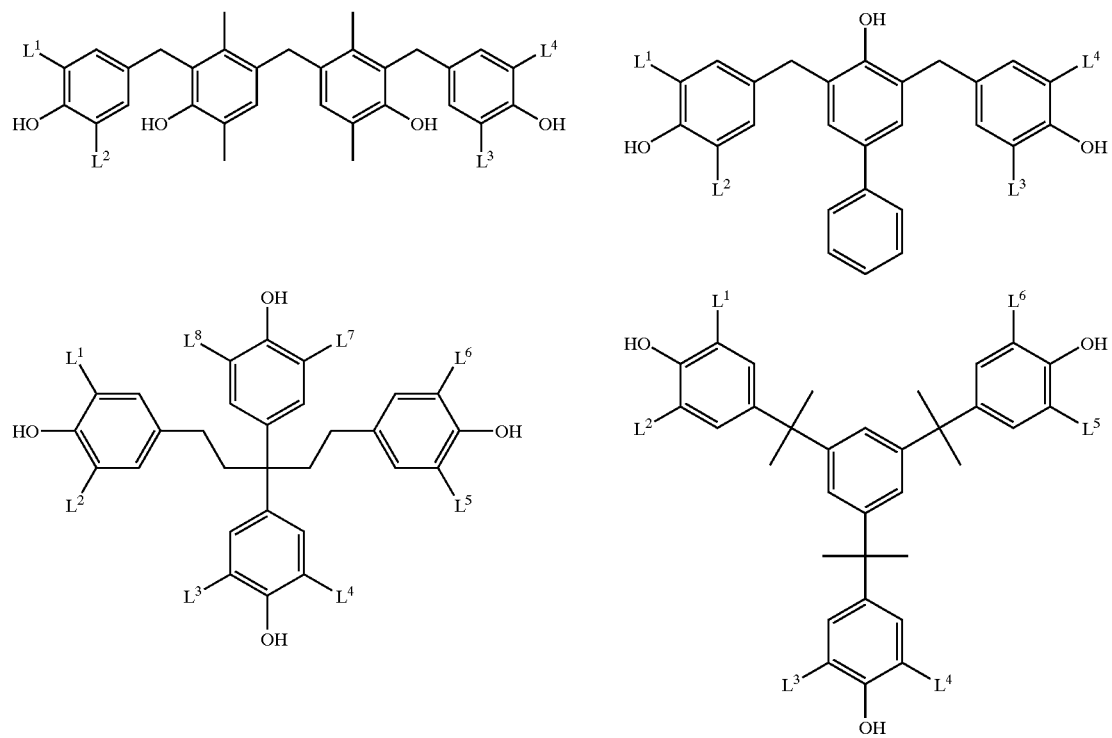

-continued
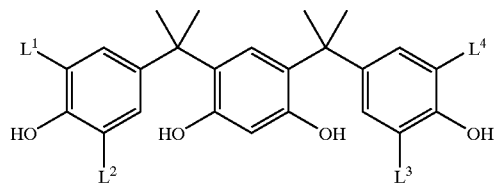
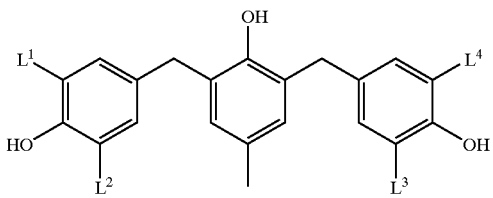
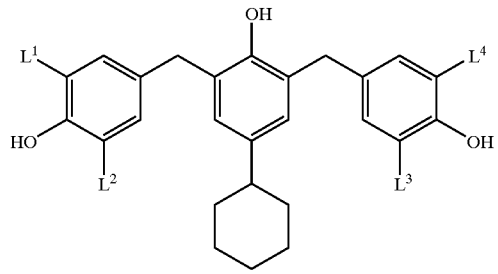
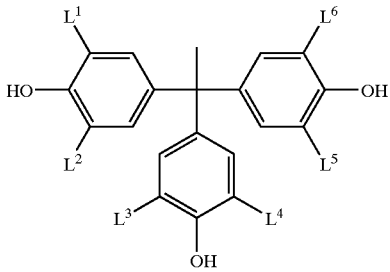
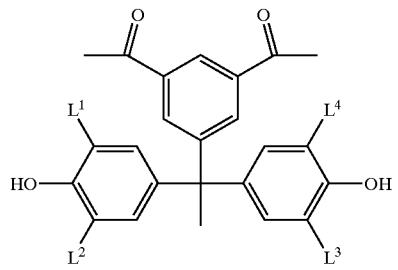
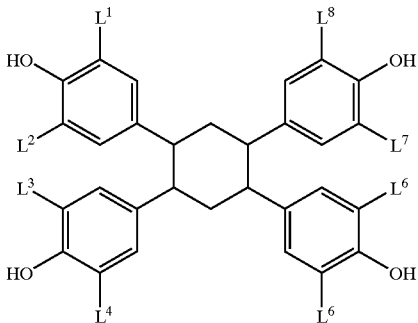
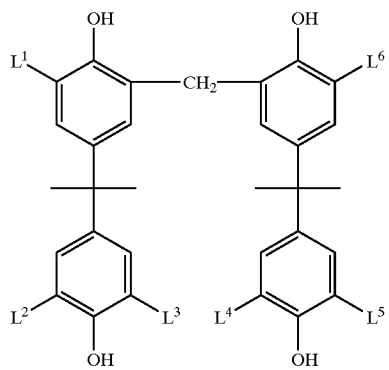
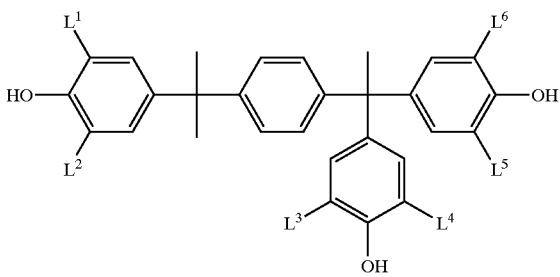
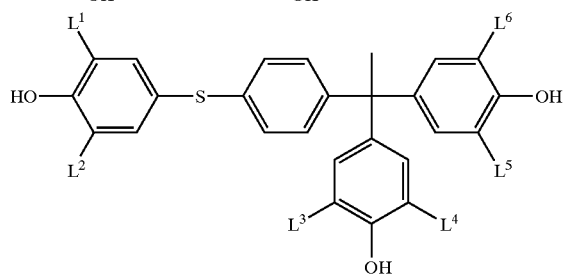
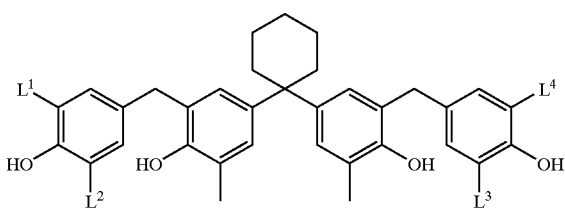
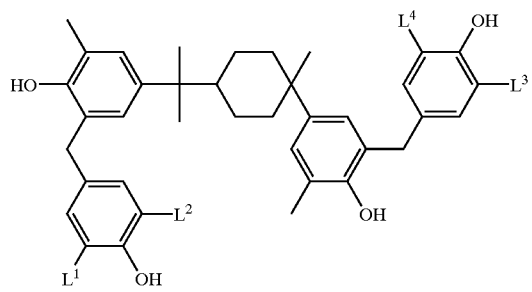
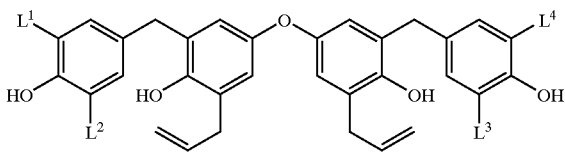

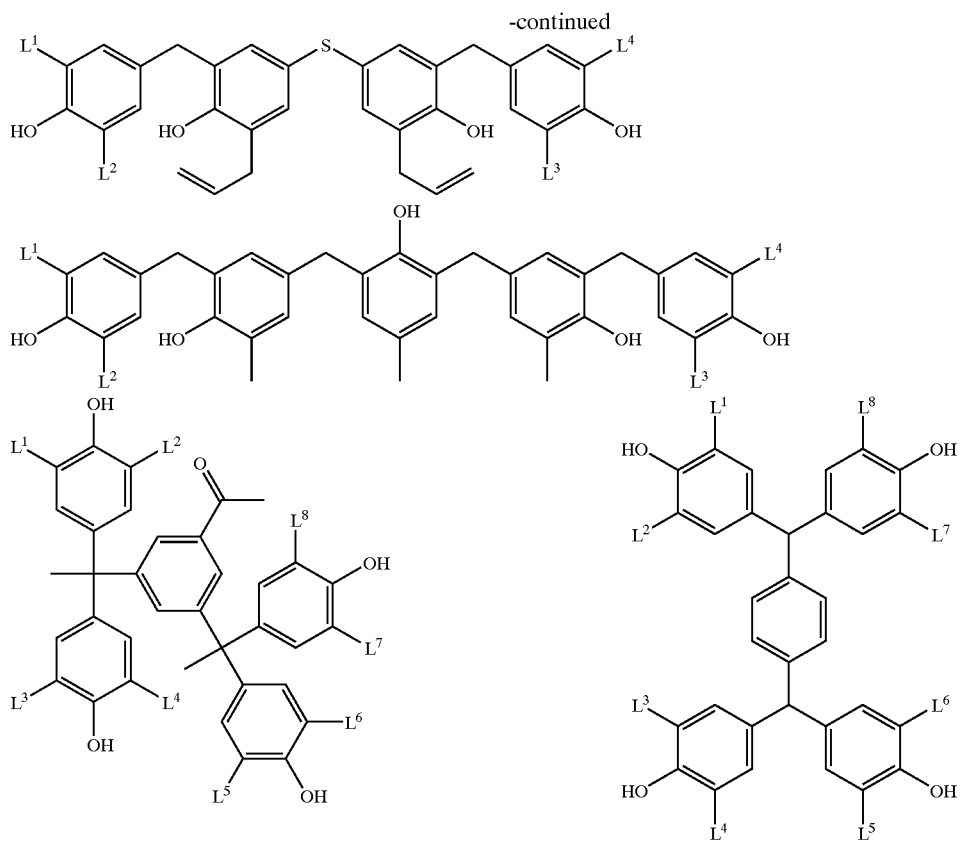

wherein $L^1$ to $L^8$, which may be the same or different, each represents a hydroxymethyl group, a methoxymethyl group or an ethoxymethyl group.

The phenol derivatives having hydroxymethyl groups can be obtained by reacting corresponding phenol compounds having no hydroxymethyl groups (compounds in which $L^1$ to $L^8$ are hydrogen atoms in the above formulas) with formaldehyde in the presence of base catalysts. In this case, the reaction is preferably conducted at a temperature of 60° C. or less, for preventing resinification and gelation. Specifically, they can be synthesized by methods described in JP-A-6-282067 and JP-A-7-64285.

The phenol derivatives having alkoxymethyl groups can be obtained by reacting corresponding phenol derivatives having hydroxymethyl groups with alcohols in the presence of acid catalysts. In this case, the reaction is preferably conducted at a temperature of 100° C. or less, for preventing resinification and gelation. Specifically, they can be synthesized by methods described in EP-A-632,003.

The hydroxymethyl group- or alkoxymethyl group-containing phenol derivatives thus synthesized are preferred in respect to stability in storage, and the alkoxymethyl group-containing phenol derivatives are particularly preferred from the viewpoint of stability in storage.

These phenol derivatives each having two or more of hydroxym ethyl groups or alkoxymethyl groups in all, in which the hydroxymethyl groups or alkoxymethyl groups are bonded collectively to at least any one of the benzene rings, or divisionally to the benzene rings, may be used either alone or as a combination of two or more of them.

Such phenol derivatives are used in an amount of 3% to 70% by weight, and preferably in an amount of 5% to 50% by weight, based on the total solid content of resist composition. When the phenol derivatives are added as the crosslinking agents in an amount of less than 3% by weight, the residual film rate is decreased. On the other hand, exceeding 70% by weight results in reduced resolution, and further unfavorably leads to deteriorated stability in storage of resist solutions.

In the invention, for example, the following other crosslinking agents (i) and (ii) are preferably used in combination with the above-mentioned phenol derivatives.

The ratio of the other crosslinking agents to the phenol derivatives is from 100/0 to 20/80, preferably from 90/10 to 40/60, and more preferably from 80/20 to 50/50, in molar ratio.

(i) Compounds having N-hydroxymethyl groups, N-alkoxymethyl groups or N-acyloxymethyl groups; and (ii) Epoxy compounds.

These crosslinking agents are described in detail below.

(i) The compounds having N-hydroxymethyl groups, N-alkoxymethyl groups or N-acyloxymethyl groups include monomer/oligomer-melamine-formaldehyde condensation products and urea-formaldehyde condensation products disclosed in EP-A-0,133,216, West German Patents 3,634,671 and 3,711,264, and benzoguanamine-formaldehyde condensation products disclosed in EP-A-0,212,482.

More preferred examples thereof include melamine-formaldehyde condensation products each having at least two free N-hydroxymethyl groups, N-alkoxymethyl groups or N-acyloxymethyl groups, and the N-alkoxymethyl derivatives are particularly preferred among others.

(ii) The epoxy compounds include monomers, dimers, oligomers and polymers of epoxy compounds each having at least one epoxy group. Examples thereof include reaction products of bisphenol A and epichlorohydrin, reaction products of low molecular weight phenol-formaldehyde resins and epichlorohydrin, and further epoxy resins described and used in U.S. Pat. No. 4,026,705 and British Patent 1,539, 192.

(4) Other Components Used in Compositions of the Invention

The negative resist compositions of the invention can further contain organic basic compounds, dyes and surfactants as needed.

(4)-1 Dyes

The suitable dyes are oil dyes and basic dyes. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (the above dyes are manufactured by Orient Kagaku Kogyo Co., Ltd.), Crystal Violet (CI42555), Methyl Violet (CI42535), Rhodamine B (CI45170B), Malachite Green (CI42000) and Methylene Blue (CI52015).

(4)-2 Organic Basic Compounds

The organic basic compounds which can be used in the invention are preferably compounds stronger in basicity than phenol, and nitrogen-containing basic compounds are preferred among others.

Preferred examples thereof include compounds having structures represented by the following formulas (A) to (E):

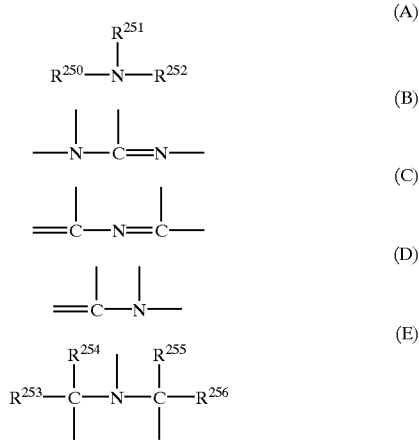

wherein
$R^{250}$, $R^{251}$ and $R^{252}$, which may be the same or different, each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, and $R^{251}$ and $R^{252}$ may combine with each other to form a ring.

$R^{253}$, $R^{254}$, $R^{255}$ and $R^{256}$, which may be the same or different, each represents an alkyl group having 1 to 6 carbon atoms.

More preferred are nitrogen-containing basic compounds each having two or more nitrogen atoms different in chemical environment in one molecule, and particularly preferred are compounds each having both a substituted or unsubstituted amino group and a nitrogen atom-containing ring structure, or compounds each having an alkylamino group.

Preferred examples thereof include substituted or unsubstituted guanidine, substituted or unsubstituted aminopyridine, substituted or unsubstituted aminoalkylpyridines, substituted or unsubstituted aminopyrrolidine, substituted or unsubstituted indazole, imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholines. Preferred substituents are amino, aminoalkyl, alkylamino, aminoaryl, arylamino, alkyl, alkoxyl, acyl, acyloxy, aryl, aryloxy, nitro, hydroxyl and cyano.

Particularly preferred examples of the compounds include but are not limited to guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methyl-pyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(amino-methyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

These nitrogen-containing basic compounds are used either alone or as a combination of two or more of them. The ratio of the photoacid generator to the organic basic compound used in the composition ((photoacid generator)/ (organic basic compound), molar ratio) is preferably from 2.5 to 300. When the molar ratio is less than 2.5, the sensitivity is decreased to cause a reduction in resolution in some cases. On the other hand, when the ratio exceeds 300, the resist pattern grows thick with an elapse of time from exposure to heat treatment to cause a reduction in resolution in some cases. The ratio ((photoacid generator)/(organic basic compound), molar ratio) is preferably from 5.0 to 200, and more preferably from 7.0 to 150.

(4)-3 Solvents

The photosensitive compositions of the invention are dissolved in solvents which can dissolve the above-mentioned respective components, and applied onto supports. Preferred examples of the solvents used herein include diethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran. These solvents are used either alone or as a mixture thereof.

(4)-4 Surfactants

Surfactants can also be added to the above-mentioned solvents. Specific examples of such surfactants include nonionic surfactants such as polyoxyethylene alkyl ethers such as polyoxyethylene lauryl ether, polyoxyethylene stearyl ether, polyoxyethylene cetyl ether and polyoxyethylene oleyl ether, polyoxyethylene alkyl allyl ethers such as polyoxyethylene octylphenol ether and polyoxyethylene nonyl-phenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine surfactants such as EFTOP EF301, EF303 and EF352 (manufactured by Shin-Akita Kasei K.K.), MEGAFAC F171 and F173 (manufactured by Dainippon Ink and Chemicals, Inc.), FLORAD FC430 and FC431 (manufactured by Sumitomo 3M Co., Ltd.), and ASAHIGUARD AG710, SURFLON S-382, SC101, SC102, SC103, SC104, SC105 and SC106 (manufactured by Asahi Glass Company Ltd.); Organopolysiloxane Polymer KP-341 (manufactured by Shin-Etsu Chemical Co., Ltd.); and acrylic or methacrylic (co) polymers, POLYFLOW No. 75 and No. 95 (manufactured by Kyoeisha Yushi Kagaku Kogyo K.K.).

The amount of the surfactants compounded is usually 2 parts or less by weight, and preferably 1 part or less by weight, per 100 parts by weight of the solid components contained in the composition of the invention.

These surfactants can be added either alone or as a combination of some of them.

In the pattern formation process on resist films in the production of precision integrated circuit elements, the negative photoresist compositions of the invention are applied onto substrates (e.g., transparent substrates such as silicon/silicon dioxide coatings, glass substrates and ITO substrates), and then irradiated using an electron beam lithography system, followed by heating, development, rinsing and drying, thereby being able to form good resist patterns.

Developing solutions which can be used for developing the negative photoresist compositions of the invention include aqueous solutions of inorganic alkalis such as sodium hydroxide, potassium hydroxide, sodium carbonate, sodium silicate, sodium metasilicate and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide and choline; and cyclic amines such as pyrrole and piperidine.

Further, alcohols such as isopropyl alcohol and/or surfactants such as nonionic surfactants can also be added in appropriate amounts to the aqueous solutions of the above-mentioned alkalis.

Of these developing solutions, preferred are the quaternary ammonium salts, and more preferred are tetramethylammonium hydroxide and choline.

The present invention will hereinafter be described in more detail by reference to examples, which are, however, not to be construed as limiting the invention.

1. Synthesis Examples of Constituent Materials
  (1) Photoacid Generators

1) Synthesis of Tetramethylammonium Pentafluorobenzene-sulfonate

Pentafluorobenzenesulfonyl chloride (25 g) was dissolved in 100 ml of methanol under ice cooling, and 100 g of a 25% aqueous solution of tetramethylammonium hydroxide was slowly added thereto, followed by stirring at room temperature for 3 hours. Thus, a solution of tetramethylammonium pentafluorobenzenesulfonate was obtained. This solution was used for salt interchange with a sulfonium salt and an iodonium salt.

2) Synthesis of Triphenylsulfonium Pentafluorobenzene-sulfonate

Diphenyl sulfoxide (50 g) was dissolved in 800 ml of benzene, and 200 g of aluminum chloride was added thereto, followed by reflux for 24 hours. The reaction solution was slowly poured on 2 liters of ice, and 400 ml of concentrated hydrochloric acid was added thereto, followed by heating at 70° C. for 10 minutes. The resulting aqueous solution was washed with 500 ml of ethyl acetate, and filtered. Then, a solution of 200 g of ammonium iodide in 400 ml of water was added thereto. The powder precipitated was collected by filtration and washed with water, followed by washing with ethyl acetate and drying. Thus, 70 g of triphenylsulfonium iodide was obtained.

Triphenylsulfonium iodide (30.5 g) was dissolved in 1,000 ml of methapol, and 19.1 g of silver oxide was added thereto, followed by stirring at room temperature for 4 hours. The resulting solution was filtered, and a solution of tetramethylammonium pentafluorobenzenesulfonate was added thereto in excess. The reaction solution was concentrated, and dissolved in 500 ml of dichloromethane. The resulting solution was washed with a 5% aqueous solution of tetramethylammonium hydroxide and water. The organic phase was dried over anhydrous sodium sulfate, and then concentrated to obtain triphenylsulfonium pentafluorobenzene-sulfonate (I-1).

3) Synthesis of Di(4-t-amylphenyl)iodonium Pentafluoro-benzenesulfonate t-Amylbenzene (60 g), 39.5 g of potassium iodate, 81 g of acetic anhydride and 170 ml of dichloromethane were mixed, and 66.8 g of concentrated sulfuric acid was slowly added dropwise thereto under ice cooling. After stirring for 2 hours under ice cooling, the mixture was stirred at room temperature for 10 hours. Then, 500 ml of water was added to the reaction solution under ice cooling, and the resulting solution was extracted with dichloromethane. The organic phase was washed with sodium hydrogen carbonate and water, and then concentrated to obtain di (4-t-amylphenyliodonium sulfate. To a solution of tetramethylammonium pentafluorobenzenesulfonate in excess the obtained sulfate was added. Then, 500 ml of water was added to the solution, and the solution was extracted with dichloromethane. Then, the organic phase was washed with a 5% aqueous solution of tetramethylammonium hydroxide and water, and then concentrated to obtain di(4-t-amylphenyl)iodonium penta-fluorobenzenesulfonate (III-1).

Other compounds can be synthesized by methods similar to the above.

(2) Crosslinking Agents
  Synthesis of Crosslinking Agent [HM-1]

To a 10% aqueous solution of potassium hydroxide, 20 g of 1-[α-methyl-α-(4-hydroxyphenyl)ethyl]-4-[α,α-bis(4-hydroxyphenyl)ethyl]benzene (Trisp-PA, manufactured by Honshu Chemical Industry Co., Ltd.) was added, and dissolved by stirring. Then, 60 ml of a 37% aqueous solution of formalin was slowly added to the solution with stirring at room temperature for 1 hour. After further stirring at room temperature for 6 hours, the solution was put into a diluted aqueous solution of sulfuric acid. The precipitate was filtered and thoroughly washed with water, followed by recrystallization from 30 ml of methanol, thereby obtaining 20 g of a white powder of hydroxymethyl group-containing phenol derivative [HM-1] having the following structure:

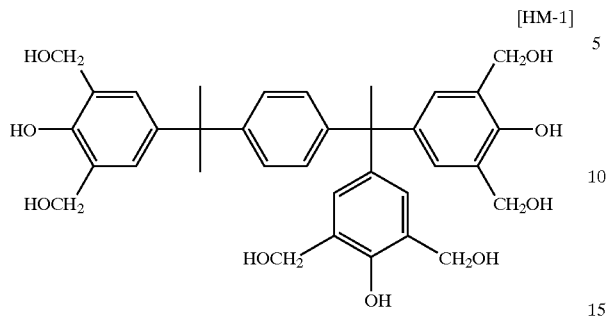
[HM-1]

Synthesis of Crosslinking Agent [MM-1]

To 1 liter of methanol, 20 g of hydroxymethyl group-containing phenol derivative [HM-1] obtained in the above-mentioned synthesis example was added, and dissolved by heat stirring. Then, 1 ml of concentrated sulfuric acid was added to the resulting solution, followed by heat reflux for 12 hours. After the reaction was terminated, the reaction solution was cooled, and 2 g of potassium carbonate was added thereto. The resulting mixture was sufficiently concentrated, followed by addition of 300 ml of ethyl acetate. The solution was washed with water, and then concentrated to dryness, thereby obtaining 22 g of white solid of methoxymethyl group-containing phenol derivative [MM-1] having the following structure. The purity was 90% (measured by the liquid chromatography method).

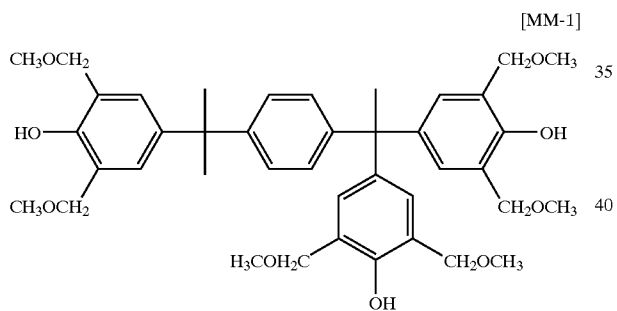
[MM-1]

Further, phenol derivative shown below were similarly synthesized.

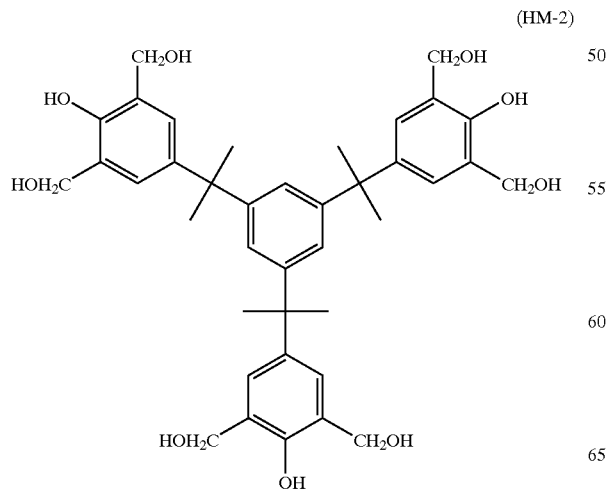
(HM-2)

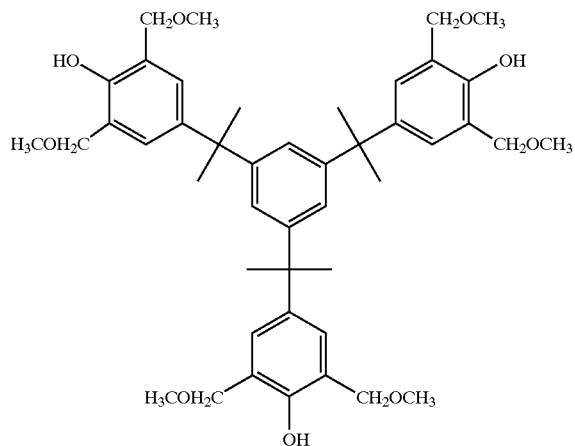
(MM-2)

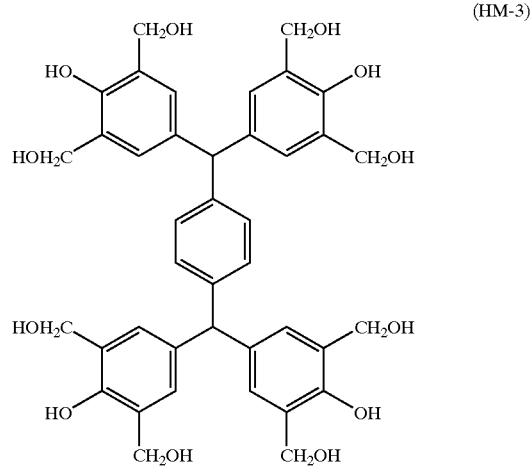
(HM-3)

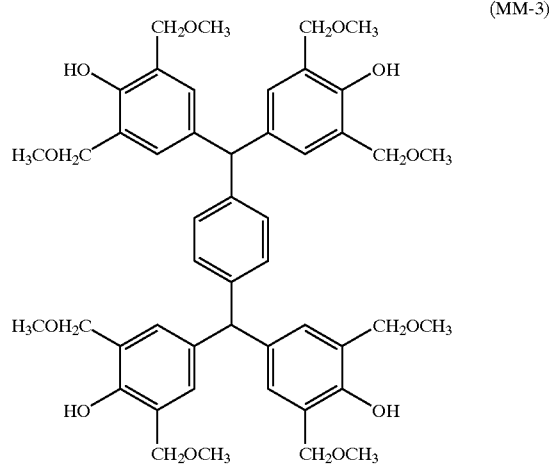
(MM-3)

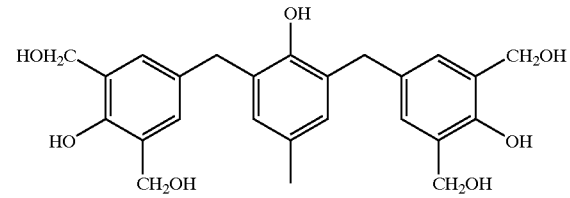
(HM-4)

-continued

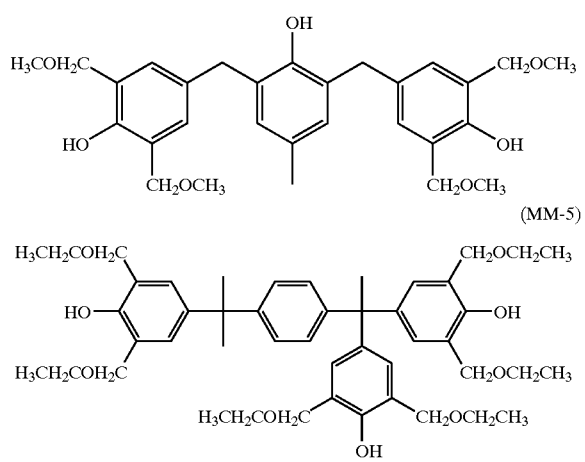

EXAMPLES 1 TO 9 AND COMPARATIVE EXAMPLES 1 TO 4

(1) Coating of Resists

Solutions of photoresist compositions shown in Table 1 were prepared by using the compounds of the invention selected from the above-mentioned synthesis examples and compounds for comparison.

Each sample solution was filtered through a 0.1-μm filter, and then, applied onto a silicon wafer by use of a spin coater, followed by drying at 110° C. for 90 seconds on a vacuum suction type hot plate to obtain a resist film having a thickness of 0.5 μm.

TABLE 1

| | Resin (g) | Acid Generator (g) | Crosslinking Agent (g) | Solvent (g) |
|---|---|---|---|---|
| Example 1 | P-1 (1.05) | I-1 (0.07) | MM-1 (0.28) | Propylene glycol monomethyl ether acetate |
| Example 2 | P-2 (1.05) | I-7 (0.07) | MM-2 (0.28) | Propylene glycol monomethyl ether acetate |
| Example 3 | P-1 (1.05) | I-9 (0.07) | MM-3 (0.28) | Propylene glycol monomethyl ether acetate |
| Example 4 | P-1 (1.05) | II-1 (0.07) | MM-4 (0.28) | Propylene glycol monomethyl ether acetate |
| Example 5 | P-2 (1.05) | II-3 (0.07) | MM-5 (0.28) | Propylene glycol monomethyl ether acetate |
| Example 6 | P-1 (1.05) | III-1 (0.07) | MM-1 (0.28) | Propylene glycol monomethyl ether acetate |
| Example 7 | P-1 (1.05) | III-4 (0.07) | MM-2 (0.28) | Propylene glycol monomethyl ether acetate |
| Example 8 | P-1 (1.05) | II-1 (0.07) | MM-1 (0.28) | Propylene glycol monomethyl ether acetate |

TABLE 1-continued

| | Resin (g) | Acid Generator (g) | Crosslinking Agent (g) | Solvent (g) |
|---|---|---|---|---|
| Example 9 | P-2 (1.05) | PAG-1 (0.07) | MM-4 (0.28) | Propylene glycol monomethyl ether acetate |
| Comparative Example 1 | P-1 (1.05) | PAG-2 (0.07) | CL-1 (0.28) | Propylene glycol monomethyl ether acetate |
| Comparative Example 2 | P-2 (1.05) | PAG-3 (0.07) | CL-2 (0.28) | Propylene glycol monomethyl ether acetate |
| Comparative Example 3 | P-1 (1.05) | PAG-4 (0.07) | CL-1 (0.28) | Propylene glycol monomethyl ether acetate |
| Comparative Example 4 | P-2 (1.05) | PAG-5 (0.07) | CL-2 (0.28) | Propylene glycol monomethyl ether acetate |

The abbreviations used in Table 1 are as follows:

<Resins>

P-1: Poly-(p-hydroxystyrene), Mw=10,000, Mw/Mn=1.4

P-2: Novolak resin, m-cresol/p-cresol=45/55 (molar ratio), Mw=6,500

<Photoacid Generators>

PAG-1

$Ph_3S^+ \; CF_3SO_3^-$

PAG-2

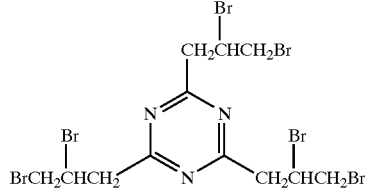

PAG-3

$Ph_3S^+$ ⟨phenyl⟩-$SO_3^-$

PAG-4

Tetrabromobisphenol A

PAG-5

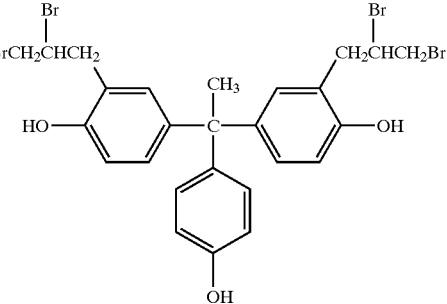

-continued

<Crosslinking Agents>

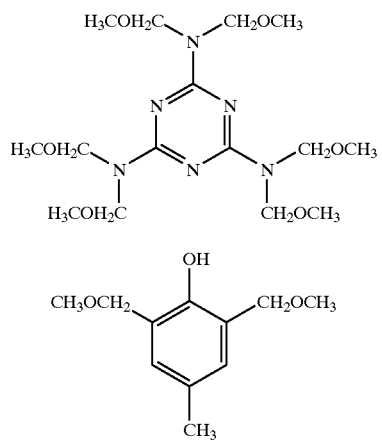

(2) Preparation of Resist Patterns

The resist films were each irradiated using an electron beam lithography system (acceleration voltage: 50 KeV). After the irradiation, the resist films were each heated for 60 seconds on a vacuum suction type hot plat of 110° C., immersed in a 2.38% aqueous solution of tetramethylammonium hydroxide (TMAH) for 60 seconds, rinsed with water for 30 seconds, and dried. The cross-sectional shape of the patterns thus obtained was observed under a scanning electron microscope.

The irradiation energy in resolving 0.20-$\mu$m lines (line:space=1:1) was taken as the sensitivity, and the threshold resolution at a dose at that time (lines were separated from spaces to resolve the lines) was taken as the resolution. When the 0.20-$\mu$m lines (line:space=1:1) were not resolved, the treshold resolution was taken as the resolution, and the irradiation energy at that time was taken as the sensitivity.

Results of property evaluation are shown in Table 2.

TABLE 2

|  | Sensitivity ($\mu$C/cm$^2$) | Resolution ($\mu$m) | Profile |
| --- | --- | --- | --- |
| Example 1 | 11 | 0.10 | Rectangular |
| Example 2 | 15 | 0.12 | Rectangular |
| Example 3 | 12 | 0.10 | Rectangular |
| Example 4 | 13 | 0.14 | Rectangular |
| Example 5 | 17 | 0.15 | Rectangular |
| Example 6 | 8 | 0.09 | Rectangular |
| Example 7 | 12 | 0.12 | Rectangular |
| Example 8 | 10 | 0.11 | Rectangular |
| Example 9 | 20 | 0.18 | Rectangular |
| Comparative Example 1 | 40 | 0.25 | Reverse tapered |
| Comparative Example 2 | 33 | 0.23 | Reverse tapered |
| Comparative Example 3 | 45 | 0.28 | Reverse tapered |
| Comparative Example 4 | 50 | 0.27 | Reverse tapered |

[Description of Evaluation Results]

The results of Table 2 show that the resist composition using the crosslinking agent of the invention and the acid generator other than the agents represented by general formulas (I) to (III) [Example 9] is higher in sensitivity and resolution than the compositions using the crosslinking agents other than the agents of the invention [Comparative Examples 1 to 4], and exhibits a rectangular profile to have excellent properties. These effects are achieved under the conditions that the negative resist composition having the crosslinking agent of the invention is irradiated with an electron beam or an X-ray, and have hitherto been unknown at all.

The compositions further containing the acid generators of the invention represented by general formulas (I) to (III) together with the crosslinking agents of the invention [Examples 1 to 8] show more excellent sensitivity, resolution and profiles.

From these, it is apparent that the compositions containing both the acid generators and crosslinking agents of the invention are particularly suitable for electron beam irradiation, and show extremely excellent properties.

According to the chemical amplification system negative resist compositions for an electron beam and/or an X-ray of the invention, the negative photosensitive compositions excellent in sensitivity and resolution, and moreover having rectangular profiles can be provided.

While the invention has been described in detail and with reference to specific embodiments thereof, it will be apparent to one skilled in the art that various changes and modifications can be made therein without departing from the spirit and scope thereof.

This application is based on Japanese patent application Hei-11-227792, filed on Aug. 11, 1999, incorporated herein by reference.

What is claimed is:

1. A chemical amplification system negative resist composition for an electron beam and/or an X-ray comprising an alkali-soluble resin, a radiation-sensitive acid generator and a crosslinking agent which initiates crosslinking by an acid, wherein the crosslinking agent is a phenol derivative having 3 to 5 benzene ring atomic groups in a molecule, having a molecular weight of 1,200 or less, and having two or more hydroxymethyl and/or alkoxymethyl groups bonded directly to the benzene ring atomic groups, and wherein the radiation-sensitive acid generator is a compound represented by any one of the following general formulas (I) to (III):

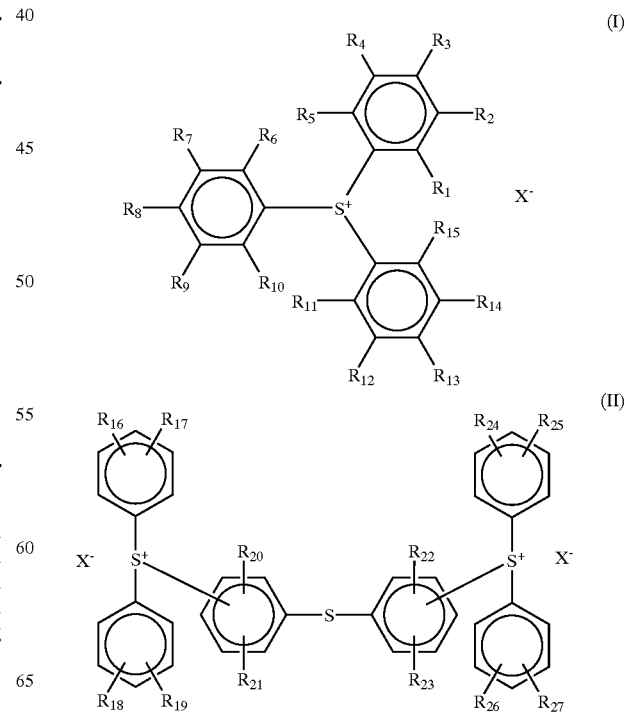

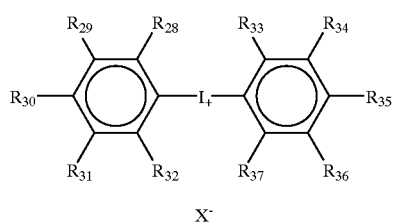

(III)

wherein $R_1$ to $R_{37}$ each represents a hydrogen atom, an alkyl group, an alkoxyl group, a hydroxyl group, a halogen atom or a group represented by —S—$R_{38}$ where $R_{38}$ represents an alkyl group or an aryl group; $R_1$ to $R_{38}$ may be the same or different; two or more selected from $R_1$ to $R_{15}$ may be combined with each other directly at their ends, or through an atom selected from oxygen, sulfur and nitrogen to form a ring structure; $R_{16}$ to $R_{27}$ may also form a ring structure similarly; $R_{28}$ to $R_{37}$ may also form a ring structure similarly; $X^-$ is an anion of an acid, wherein said acid is selected from the group consisting of benzenesulfonic acid, naphthalenesulfonic acid and anthracenesulfonic acid and wherein said acid is substituted by at least one fluorine atom or has at least one organic group selected from the group consisting of an alkyl group, an alkoxyl group, an acyl group, an acyloxy group, a sulfonyl group, a sulfonyloxy group, a sulfonylamino group, an aryl group, an aralkyl group and an alkoxycarbonyl group, wherein said organic group is substituted by at least one fluorine atom.

2. The negative resist composition according to claim 1, wherein the amount of the radiation-sensitive acid generator is from 0.1% to 20% by weight based on the total solid content of the negative resist composition.

3. The negative resist composition according to claim 1, wherein the amount of the radiation-sensitive acid generator is from 0.5% to 10% by weight based on the total solid content of the negative resist composition.

4. The negative resist composition according to claim 1, wherein the amount of the radiation-sensitive acid generator is from 1% to 7% by weight based on the total solid content of the negative resist composition.

5. The negative resist composition according to claim 1, wherein the phenol derivative as the crosslinking agent comprises alkoxymethyl groups bonded directly to the benzene ring atomic groups.

6. The negative resist composition according to claim 1, wherein the amount of the phenol derivative as the crosslinking agent is from 3% to 70% by weight based on the total solid content of the negative resist composition.

7. The negative resist composition according to claim 1, wherein the amount of the phenol derivative as the crosslinking agent is from 5% to 50% by weight based on the total solid content of the negative resist composition.

* * * * *